(12) United States Patent
Tu

(10) Patent No.: US 8,399,921 B2
(45) Date of Patent: Mar. 19, 2013

(54) METAL OXIDE SEMICONDUCTOR (MOS) STRUCTURE AND MANUFACTURING METHOD THEREOF

(75) Inventor: Kao-Way Tu, Jhonghe (TW)

(73) Assignee: Niko Semiconductor Co., Ltd., Sijhih (TW)

( * ) Notice: Subject to any disclaimer, the term of this patent is extended or adjusted under 35 U.S.C. 154(b) by 503 days.

(21) Appl. No.: 12/567,194

(22) Filed: Sep. 25, 2009

(65) Prior Publication Data

US 2010/0276750 A1    Nov. 4, 2010

(30) Foreign Application Priority Data

May 1, 2009   (TW) ................................ 98114621 A

(51) Int. Cl.
*H01L 29/78*       (2006.01)
(52) U.S. Cl. ........ 257/330; 257/331; 257/332; 257/409; 257/355; 257/618; 257/E29.262; 257/E21.41; 438/270; 438/269
(58) Field of Classification Search ............ 257/E29.262, 257/330, 331, 332, 409, 355, 618, E21.41; 438/270, 269
See application file for complete search history.

(56) References Cited

U.S. PATENT DOCUMENTS

| 7,713,822 B2 * | 5/2010 | Thorup et al. ................ 438/270 |
| 2002/0088990 A1 * | 7/2002 | Iwamoto et al. .............. 257/136 |

* cited by examiner

*Primary Examiner* — Junghwa M Im
(74) *Attorney, Agent, or Firm* — Schmeiser, Olsen & Watts LLP

(57) ABSTRACT

The manufacturing method includes the steps of: providing a semiconductor base of a first conduction type; forming a first epitaxial layer with a plurality of epitaxial pillars of therein on a first surface of the semiconductor base, wherein the epitaxial pillars have a conduction type opposite to the first epitaxial layer; forming a plurality of first shallow trenches and a plurality of second shallow trenches alternately on the epitaxial pillars and the first epitaxial layer, wherein the first shallow trench has a width greater than the width of the second shallow trench and the first shallow trench is extended downward to the epitaxial pillar; and forming a plurality of gate regions in the first shallow trenches respectively; forming a plurality of source regions on both sides of the first shallow trench; and forming a source metal conducting wire to connect the source regions.

24 Claims, 11 Drawing Sheets

METAL OXIDE SEMICONDUCTOR (MOS) STRUCTURE AND MANUFACTURING METHOD THEREOF

CROSS-REFERENCE TO RELATED APPLICATIONS

This non-provisional application claims priority under 35 U.S.C. §119(a) on Patent Application No(s). 098114621 filed in Taiwan, R.O.C. on 1 May 2009, the entire contents of which are hereby incorporated by reference.

FIELD OF THE INVENTION

The present invention relates to a semiconductor structure and a manufacturing method thereof, in particular to a metal oxide semiconductor (MOS) structure and a manufacturing method thereof.

BACKGROUND OF THE INVENTION

Metal oxide semiconductor (MOS) devices have been applied extensively in various power switch components, and the high breakdown voltage and the low on-resistance are two main features required for these applications.

For the general power MOS device, the on-resistance of the MOS device depends on the thickness of the epitaxial layer, whereas, the breakdown voltage also depends on the thickness of the epitaxial layer. The way of increasing the breakdown voltage by increasing the thickness of the epitaxial layer may result in the increasing of the on-resistance. On the other hand, the way of reducing the on-resistance by decreasing the thickness of the epitaxial layer may lower down the breakdown voltage. Thus, the high breakdown voltage and the low on-resistance cannot be taken care concurrently.

To improve the shortcomings of the general MOS device and find out a solution of accessing the low on-resistance and the high breakdown voltage simultaneously, new-generation MOS devices with a super junction structure has been disclosed. For example, the article "COOLMOS—a new milestone in high voltage power MOS" published in the Power Semiconductor Devices and ICs by L. Lorenz, G. Deboy in 1999 teaches a MOS device with the super junction structure being named as COOLMOS, which is a registered trademark of Infineon Technologies AG.

With reference to FIG. 1 for a MOS device having a super junction structure, the MOS device includes an N-type cylindrical structure 13 and a P-type cylindrical structure 15 alternately formed on an N-type base 11, wherein the N-type cylindrical structure 13 constitutes a current path. As the drain and the source of the MOS device are reverse biased, a depletion region between the N-type cylindrical structure 13 and the P-type cylindrical structure 15 is expanded transversely to cut off the electrically conduction path. As mentioned, the on-resistance of the MOS device depends on the doping concentration of the N-type cylindrical structure 13, and the breakdown voltage depends on the thickness of the epitaxial layer. The increasing of the doping concentration of the N-type cylindrical structure 13 for reducing the on-resistance would not lower down the breakdown voltage. Accordingly, the MOS device is capable to prevent the breakdown voltage from being reduced when lowering the on-resistance, and thus can achieve the effect of suppressing the on-resistance and provide a voltage withstanding property higher than that of the traditional power MOS device.

However, the super junction structure as shown in FIG. 1 requires a complicated fabrication process, which includes a plurality of epitaxial layer growing steps for growing the epitaxial layers A~F, and the respective lithographic and patterning steps, and the respective ion-implantation steps. In addition, each lithographic step requires an aligning procedure to have the doping regions formed in the epitaxial layers A~F aligned with each other to complete the cylindrical structure, and thus the prior art incurs high production cost and long manufacturing time.

Therefore, it is a main subject for the present invention to use a simplified manufacturing process to produce a MOS device with a high breakdown voltage and a low on-resistance.

SUMMARY OF THE INVENTION

In view of the aforementioned shortcomings of the complicated conventional manufacturing process of a super-junction structure, it is an objective of the present invention provides a simplified manufacturing process to achieve the features of a high breakdown voltage and a low on-resistance, without requiring a complicated manufacturing process including repeated epitaxial growing and lithographic processes.

Another objective of the present invention is to provide a MOS structure and a manufacturing method thereof to enhance the breakdown current effectively and increase the avalanche breakdown voltage.

To achieve the foregoing objective, the present invention provides a MOS structure comprising an active region. The active region comprises a semiconductor substrate, a plurality of first shallow trenches and a plurality of second shallow trenches, a plurality of gate regions, a plurality of source regions, and a source metal conducting wire. The semiconductor substrate includes a semiconductor base of a first conduction type, a first epitaxial layer, and a plurality of epitaxial pillars, wherein the semiconductor base includes a first surface and a second surface, the first epitaxial layer is formed on the first surface and has a plurality of deep trenches formed therein, the epitaxial pillars are formed in the deep trenches and have a conduction type opposite to that of the first epitaxial layer. The first shallow trenches and the second shallow trenches are alternately formed in the semiconductor substrate, wherein the first shallow trenches are extended downward to the corresponding epitaxial pillar, and the first shallow trench has a width greater than that of the second shallow trench. The gate regions are formed in the first shallow trenches respectively. The source regions are formed between the first shallow trenches and the second shallow trenches. The source metal conducting wire is connected to the source regions.

To achieve the foregoing objective, the present invention provides a MOS manufacturing method for forming an active region, and the method comprises the steps of: providing a semiconductor base of a first conduction type, wherein the semiconductor base includes a first surface and a second surface; forming a first epitaxial layer with a plurality of epitaxial pillars therein on the first surface of the semiconductor base, and the epitaxial pillar having a conduction type opposite to that of the first epitaxial layer; forming a plurality of first shallow trenches and a plurality of second shallow trenches alternately above the epitaxial pillars, wherein the first shallow trench has a width greater than a width of the second shallow trench and the first shallow trench is extended downward to the epitaxial pillar; forming a plurality of gate regions in the first shallow trenches respectively; forming a plurality of source regions on both sides of the first shallow trenches respectively; and forming a source metal conducting wire to connect the source regions.

The step of forming the first epitaxial layer with the epitaxial pillars therein comprises: forming the first epitaxial layer on the first surface of the semiconductor base; forming a plurality of deep trenches in the first epitaxial layer; and forming the epitaxial pillars in the deep trenches.

The step of forming the first epitaxial layer with the epitaxial pillars therein comprises: forming an epitaxial pillar layer on the first surface of the semiconductor base; etching the epitaxial pillar layer to form the epitaxial pillars; and forming a first epitaxial layer of a conduction type opposite to that of the epitaxial pillar between the epitaxial pillars.

Another objective of the present invention is to provide a MOS structure and a manufacturing method thereof, such that even if an epitaxial pillar is not aligned precisely with a gate region, the epitaxial pillar can be electrically coupled to the gate region through the epitaxial pillar in the terminal region to have the semiconductor components operated correctly.

To achieve the foregoing objective, the present invention provides a MOS structure comprising a terminal region. The terminal region has a plurality of terminal region epitaxial pillars disposed in the semiconductor substrate and surrounding the epitaxial pillars.

To achieve the foregoing objective, the present invention provides a MOS manufacturing method with a plurality of terminal region epitaxial pillars surrounding the epitaxial pillars being formed while forming the epitaxial pillars in the active region.

The semiconductor substrate in accordance with an embodiment of the present invention further comprises a second epitaxial layer of a first conduction type, formed on the epitaxial pillars and on the first epitaxial layer, and the first shallow trenches and the second shallow trench are alternately formed in the second epitaxial layer, wherein the second epitaxial layer is of a conduction type opposite or identical to that of the first epitaxial layer.

In accordance with an embodiment of the present invention, the first shallow trench has a depth greater than that of the second shallow trench, and the sidewall of the first shallow trench has a ladder-type structure dividing the first shallow trench into an upper portion and a lower portion, and the upper portion has a width greater than that of the lower portion.

In accordance with an embodiment of the present invention, the distance between two adjacent first shallow trenches is no greater than a distance between two adjacent epitaxial pillars.

In accordance with an embodiment of the present invention, source regions are disposed on both sides of the first shallow trenches and the second shallow trenches, respectively.

The procedure of forming the first shallow trenches and the second shallow trenches in accordance with an embodiment of the present invention comprises the steps of: forming a pattern layer on the second epitaxial layer to define the first shallow trenches and the second shallow trenches, and a width of the first shallow trench being greater than that of the second shallow trench; etching the second epitaxial layer through the pattern layer to form the first shallow trenches and the second shallow trenches; forming a protective layer covering a sidewall and a bottom of the first shallow trenches and filling the second shallow trenches; etching the protective layer to expose the bottom of the first shallow trenches; and etching the second epitaxial layer through the remaining protective layer and the pattern layer to form a plurality of caves at the bottoms of the first shallow trenches.

In accordance with an embodiment of the present invention, the second shallow trenches are extended downward to the first epitaxial layer, and the first shallow trenches and the second shallow trenches are of equal depth.

DESCRIPTION OF THE PREFERRED EMBODIMENTS

Other features and advantages of the present invention will become apparent in the following detailed description of the preferred embodiments with reference to the accompanying drawings.

In any preferred embodiment of the present invention described below, a first conduction type and a second conduction type refer to P-type or N-type. In other words, if the first conduction type is N-type, then the second conduction type would be P-type. On the other hand, if the first conduction type is P-type, then the second conduction type would be N-type. In the embodiment mentioned below, the first conduction type is N-type and the second conduction type is P-type.

In addition, N+ and P+ described in the embodiments of the present invention refer to heavily doped N-type and P-type regions respectively, and N- and P- refer to lightly doped N-type and P-type regions respectively. The phrases "heavily doped" and "lightly doped" are relative terms, and not intended to constitute a limitation of the present invention.?

Figure 1:
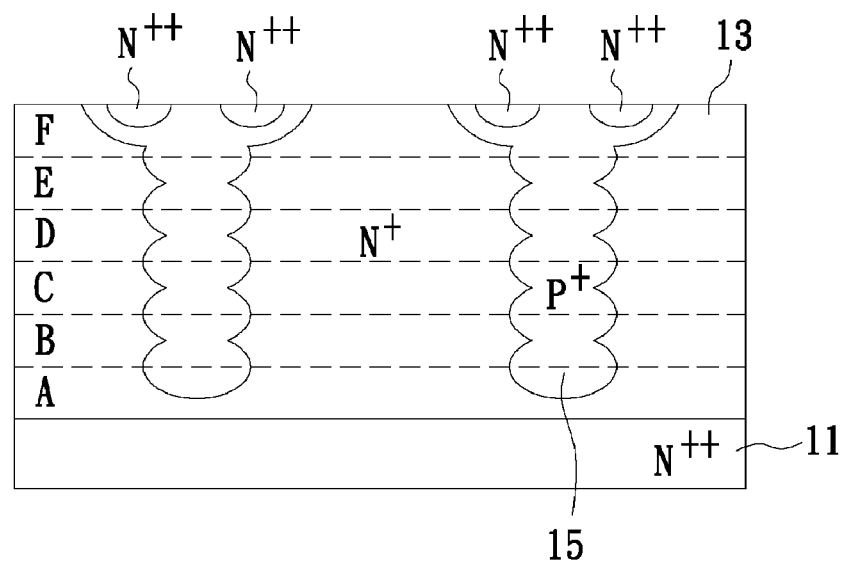
FIG. 1 is a cross-sectional view of a MOS device with a conventional super-junction structure.
Figure 2A:
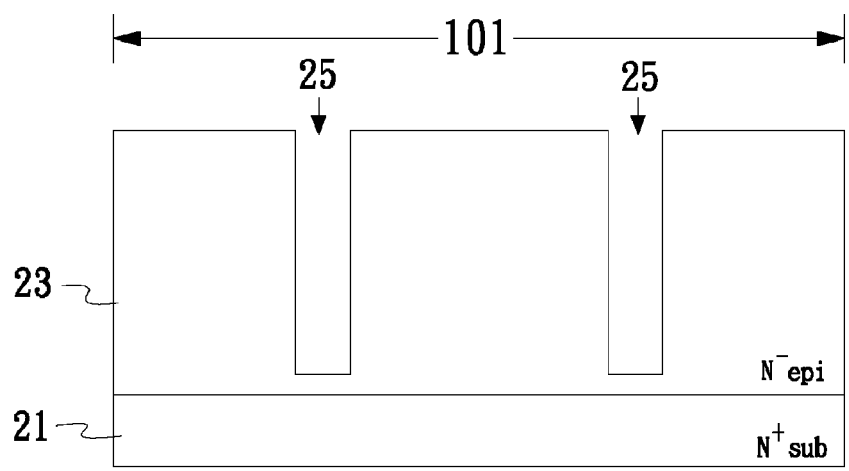
FIGS. 2A to 2H are cross-sectional views illustrating a manufacturing procedure of a MOS device in accordance with a preferred embodiment of the present invention.

With reference to FIGS. 2A to 2H, a manufacturing procedure of a MOS device in accordance with a preferred embodiment of the present invention is described. FIG. 2A shows a cross-sectional view of an active region 101 of the MOS device. Firstly, an N-type (first conduction type) doped first epitaxial layer 23 is grown on a first surface of an N+ type (first conduction type) doped semiconductor base 21. It is noted that the withstanding voltage of the MOS device depends on the thickness of the first epitaxial layer 23. For example, the first epitaxial layer 23 of a thickness of approximately 15~50 μm is applicable for a semiconductor device with an on-resistance from 2 to 10 ohm-cm and a withstanding voltage of 400~600V. In this preferred embodiment, the first epitaxial layer 23 of a thickness of 50 μm, which is applicable for semiconductor device with an on-resistance of 2~6 ohm-cm and a withstanding voltage of 400~600V, is described below as an example.

An etching process is carried out for forming a plurality of deep trenches 25 in the first epitaxial layer 23, and the etched depth of the deep trenches 25 is smaller than a thickness of the first epitaxial layer 23. The etching process may be carried out by using the typical dry etching technology, but the persons skilled in the art can use other etching methods to achieve the same device.

Figure 7:
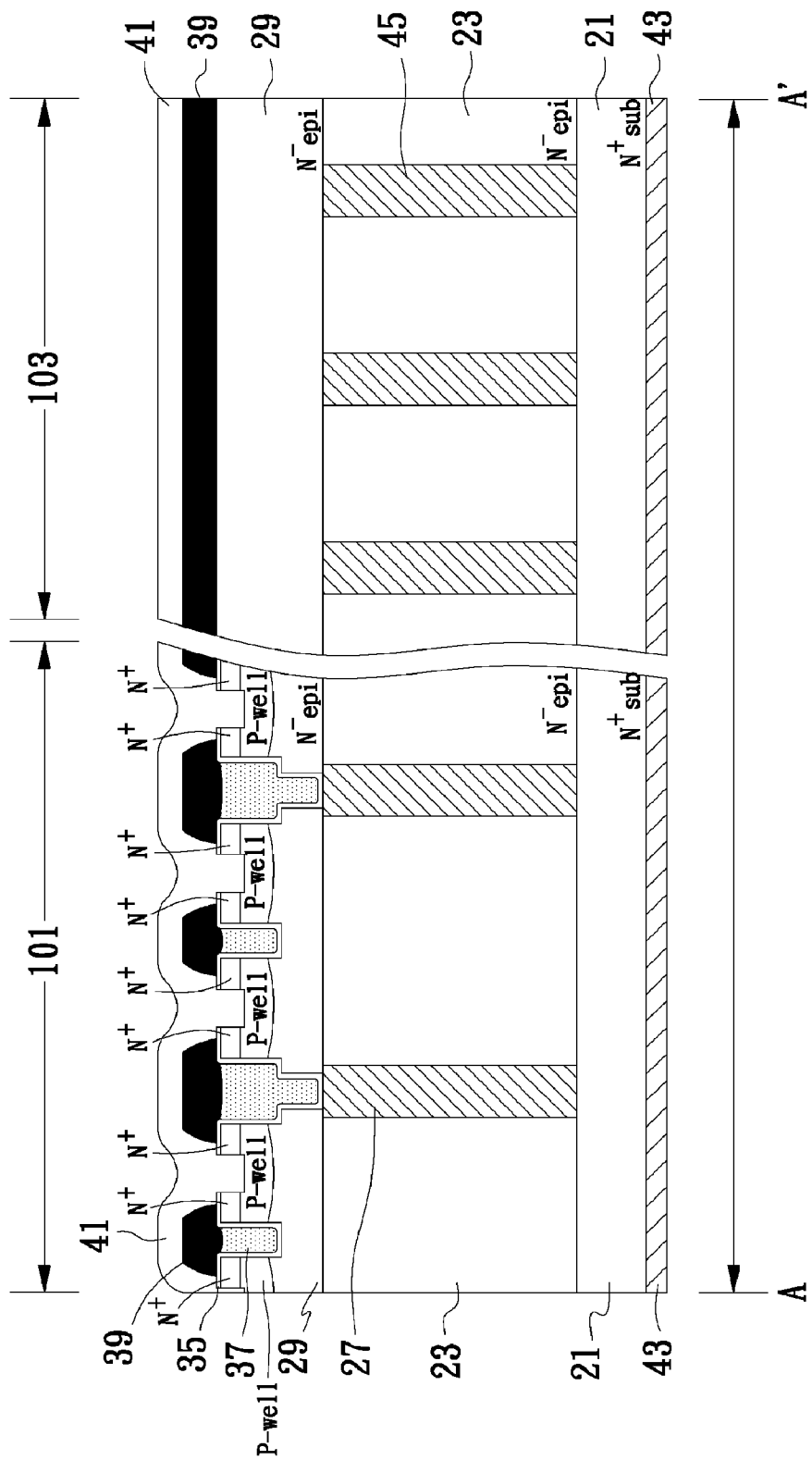
FIG. 7 is a cross-sectional view of a MOS device including a terminal region in accordance with another preferred embodiment of the present invention.

In this preferred embodiment, the deep trench 25 has a depth smaller than the thickness of the first epitaxial layer 23. However, the present invention is not limited to such arrangement. The deep trenches 25 may penetrate the first epitaxial layer 23 to the semiconductor base 21 as shown in FIG. 7.

Figure 2B:
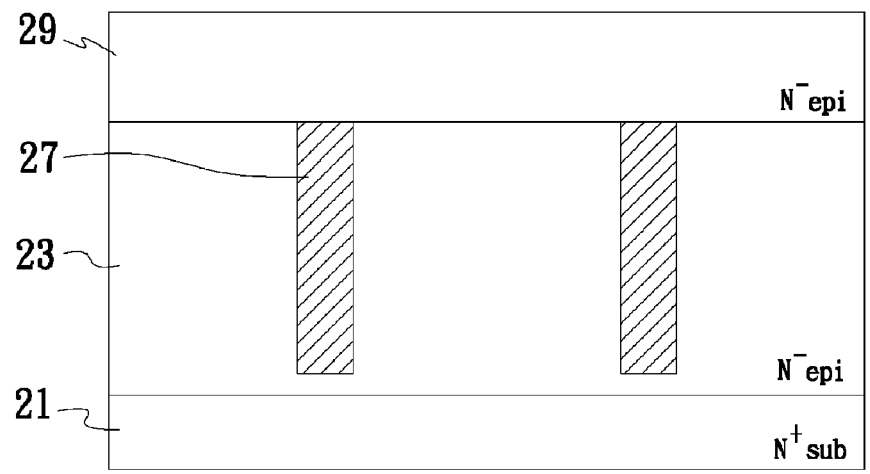

With reference to FIG. 2B, an epitaxial layer with a plurality of P-type (second conduction type) epitaxial pillars 27 in the deep trenches 25 is grown, and then a planarization process is performed to remove extra epitaxial material over the first epitaxial layer 23 and the openings of the deep trenches 25. Finally, an N-type (first conduction type) second epitaxial layer 29 is formed on the first epitaxial layer 23, and a semiconductor substrate is thus formed.

It is noteworthy to point out that the first epitaxial layer 23 and the epitaxial pillars 27 have conduction types opposite to one another. In other words, if the first epitaxial layer 23 is of the first conduction type, then the epitaxial pillars 27 will be of the second conduction type, and if the first epitaxial layer 23 is the second conduction type, then the epitaxial pillars 27 will be of the first conduction type. The aforementioned two situations can be applied to the present invention.

Figure 2C:
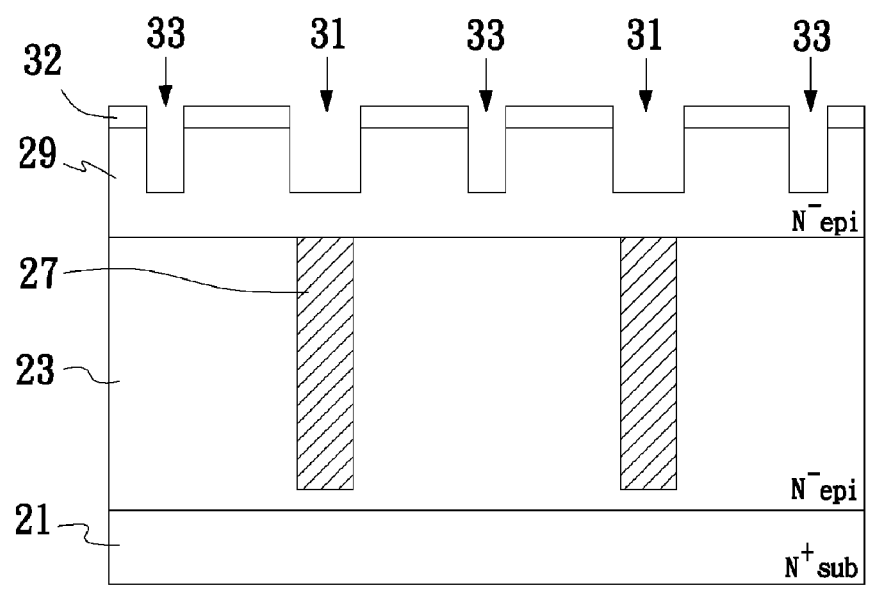

Afterward, with reference to FIG. 2C, a pattern layer 32, such as a silicon nitride hard mask, is formed on the second epitaxial layer 29, and then an etching process is performed through the pattern layer 32 to form a plurality of first shallow trenches 31 and a plurality of second shallow trenches 33 alternately arranged in the semiconductor substrate. The shallow trenches 31, 33 are of equal etching depth, which is approximately equal to 1.0~3.0 μm in this preferred embodiment. Secondly, a distance between two adjacent first shallow trenches 31 is preferably no greater than a distance between two adjacent epitaxial pillars 27. In this preferred embodiment, the distance between two adjacent first shallow trenches 31 is equal to the distance between two adjacent epitaxial pillars 27.

Figure 2D:
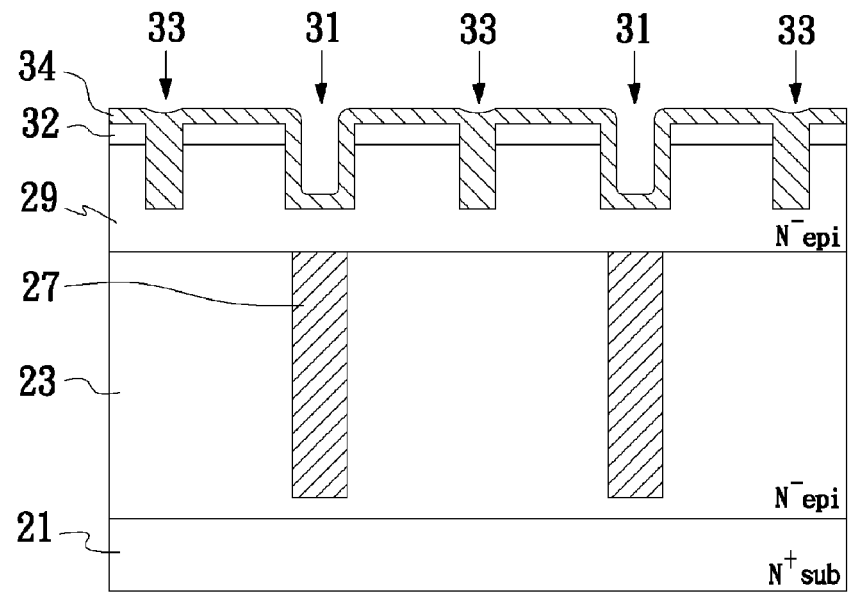

With reference to FIG. 2D, a protective layer 34, such as a silicon nitride layer (SiNx), is deposited on the pattern layer 32 and on a sidewall and a bottom of the shallow trenches 31, 33. Compared with the first shallow trench 31, because the second shallow trench 33 has a smaller opening, the second shallow trench 33 can be selectively filled up by the protective layer as the thickness of the protective layer 34 is adjusted appropriately.

Figure 2E:
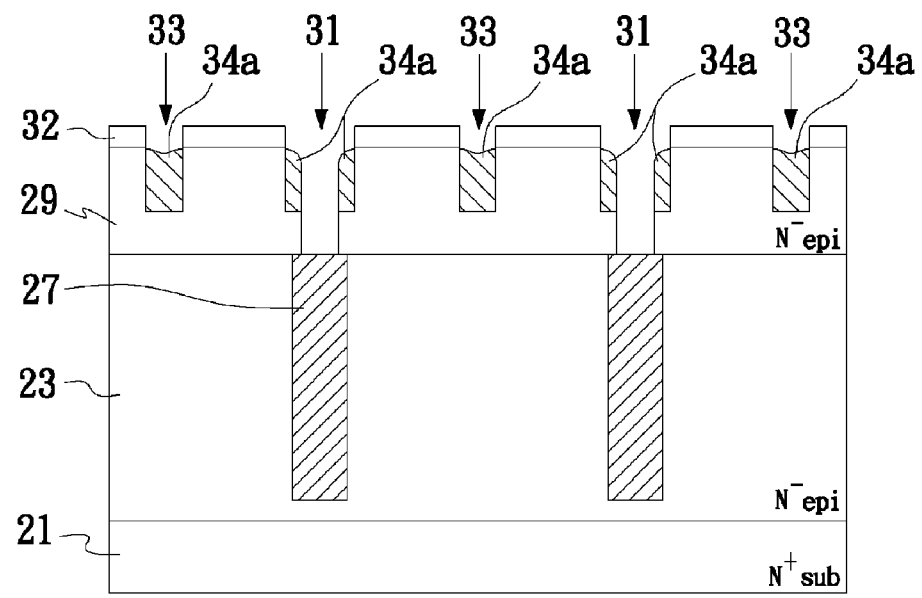

With reference to FIG. 2E, an anisotropic etching process is carried out to remove a portion of the protective layer 34, and a portion of the protective layer 34a is remained in the shallow trenches 31, 33. After the anisotropic etching process, the bottom of the second shallow trenches 33, which are filled with the protective layer 34, is still covered by the remained protective layer 34a. However, after the anisotropic etching, the bottom of the first shallow trenches 31 is exposed, and the remained protective layer 34a is situated at the sidewalls of the first shallow trenches 31 as spacers for facilitating the manufacture of extended trenches. Then, the remained protective layer 34a and the pattern layer 32 are used as mask layers for downward etching the second epitaxial layer 29 to form caves at the bottom of the first shallow trenches 31 and extended to a position in touch with the epitaxial pillars 27.

With this procedure, a ladder-type structure is formed on a side of the first shallow trench 31 to have the first shallow trench 31 divided into an upper portion and a lower portion (which is the caves), and the upper portion has a width greater than the width of the lower portion. Then, the remaining protective layer 34a and the pattern layer 32 are removed.

Figure 2F:
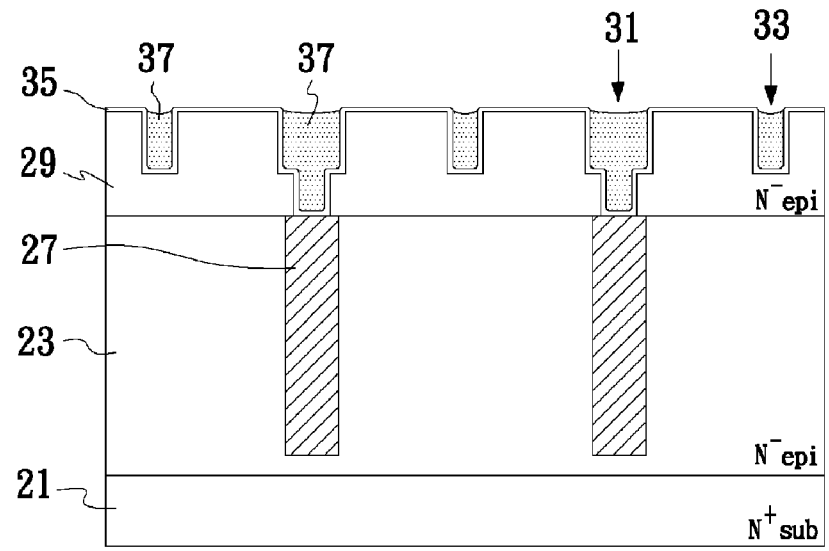

With reference to FIG. 2F, a first dielectric layer 35 is deposited on internal walls and the bottom of the first shallow trenches 31 and the second shallow trenches 33, wherein the portion of the first dielectric layer 35 situated at the bottom of the first shallow trenches 31 is in contact with the epitaxial pillars 27. Then, the first shallow trenches 31 and the second shallow trenches 33 are filled with a polysilicon structure 37 so that a gate region is formed in each of the first shallow trenches 31. The first dielectric layer 35 can be a silicon nitride layer or a silicon oxide layer.

Figure 2G:
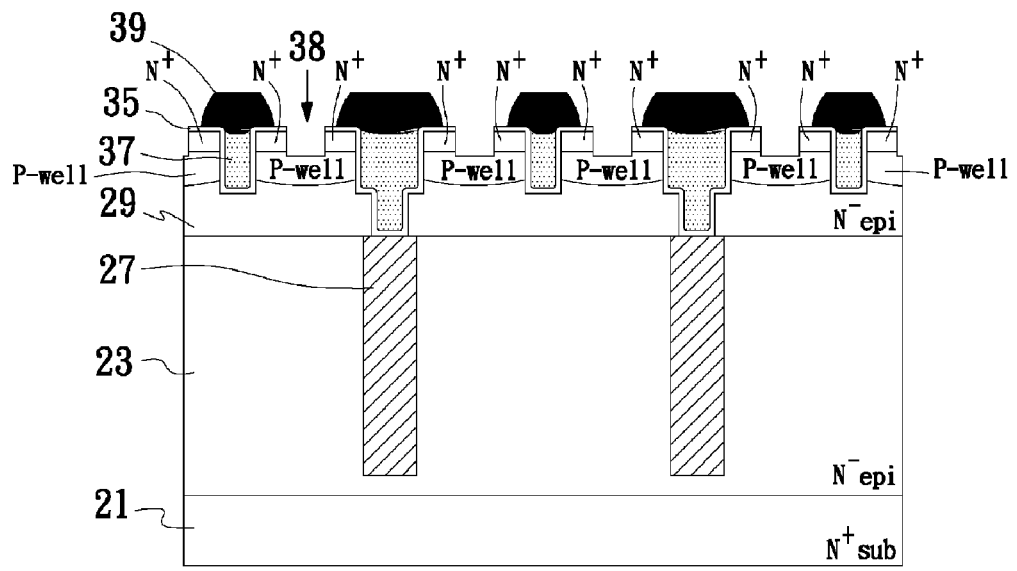

Thereafter, with reference to FIG. 2G, an ion-implantation process is performed. Firstly, boron ions are implanted into the second epitaxial layer 29 and then the implanted boron ions are driven-in by annealing so as to form a P-well as shown in the figure. Afterward, a heavily doped N+ source region is formed by implanting arsenic ions into the P-well. The P-well or the source region may be formed by using a blanket implantation process, or a lithographic step can be used to define the location of the source region before the ion implantation process. Therefore, a plurality of source regions can be formed in the second epitaxial layer 29 between the first shallow trenches 31 and the second shallow trenches 33. In other words, the source regions are disposed on both sides of the first shallow trenches 31 and the second shallow trenches 33 respectively. Then, a second dielectric layer 39 is deposited over the second epitaxial layer 29. The second dielectric layer 39 can be made of boron-phosphosilicate glass (BPSG). Then a photoresist layer is formed over the second dielectric layer 39 for etching a portion of the second dielectric layer 39 to expose the source regions. After the photoresist layer is removed, the remained second dielectric layer 39 is used as a mask layer for downward etching the second epitaxial layer 29 to form an opening 38 in the second epitaxial layer 29 as a source contact.

Figure 2H:
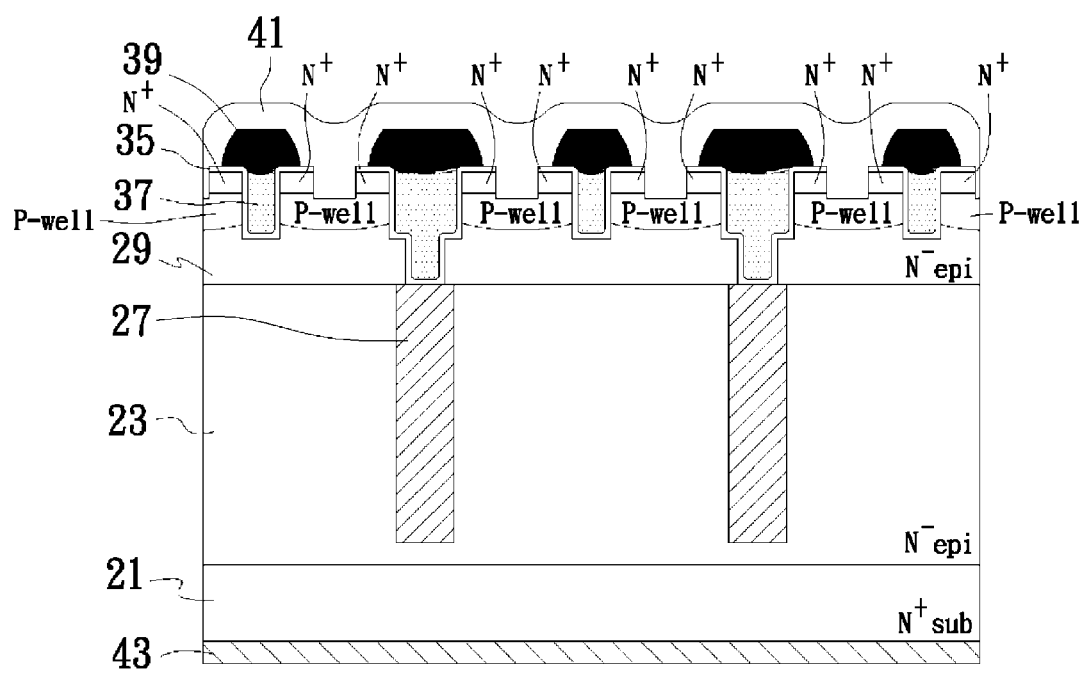

With reference to FIG. 2H, a source metal conducting wire 41 is deposited on the second epitaxial layer 29 and in contact with the source regions, and a drain metal conducting wire 43 is formed on a second surface of the semiconductor base 21 to complete a MOS fabrication process.

Figure 3:
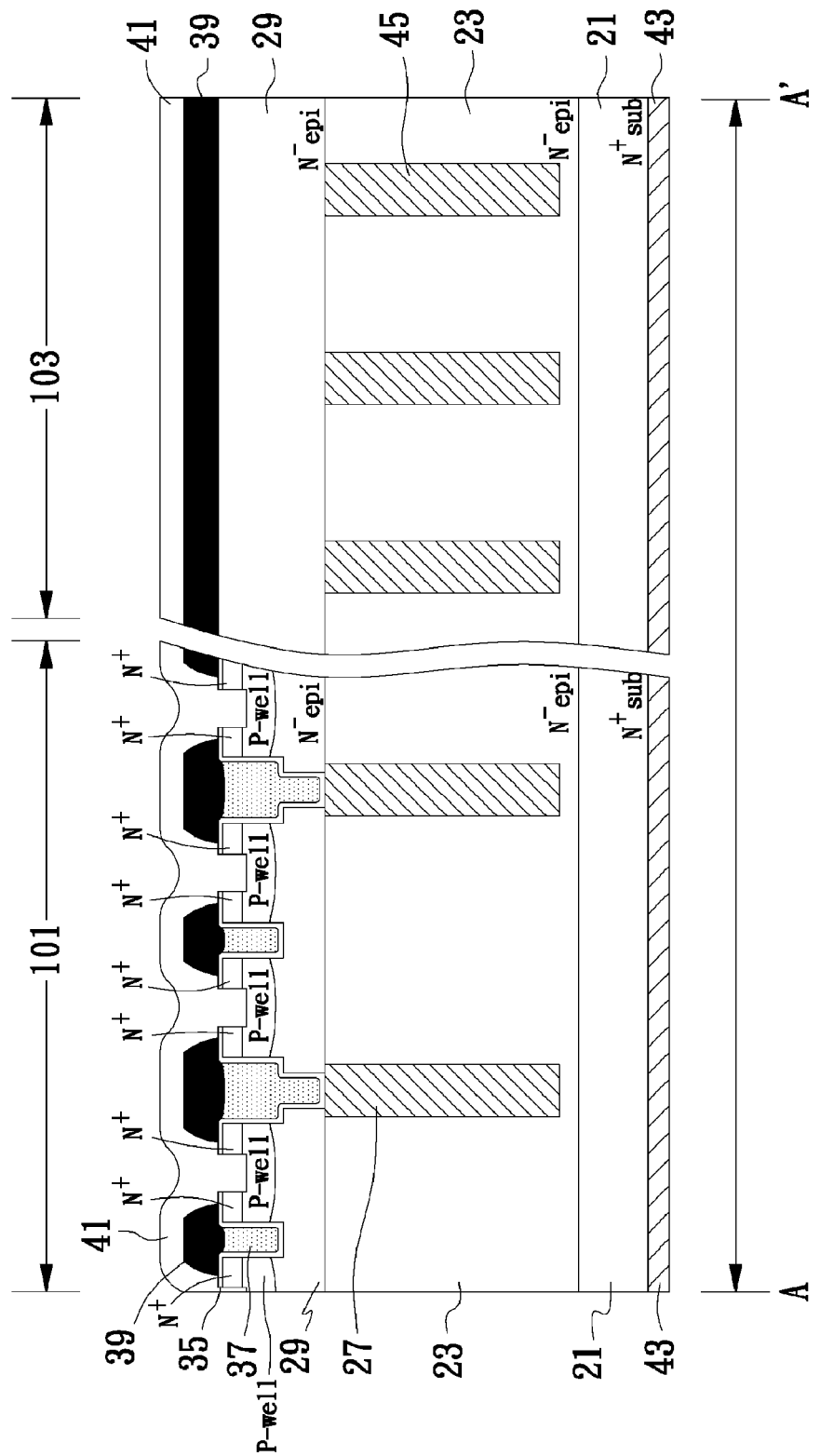
FIG. 3 is a cross-sectional view of a MOS device including a terminal region in accordance with a preferred embodiment of the present invention.

FIG. 3 is a cross-sectional view of a MOS device including a terminal region in accordance with a preferred embodiment of the present invention. As shown, a plurality of terminal region epitaxial pillars 45 is formed in the terminal region 103 of the MOS device. The terminal region epitaxial pillars 45 may be formed in the steps of forming the deep trenches 25 and the epitaxial pillars 27 in the active region 101, and then the second dielectric layer 39 and the source metal conducting wire 41 formed in the following steps are extended to the terminal region 103.

Figure 4:
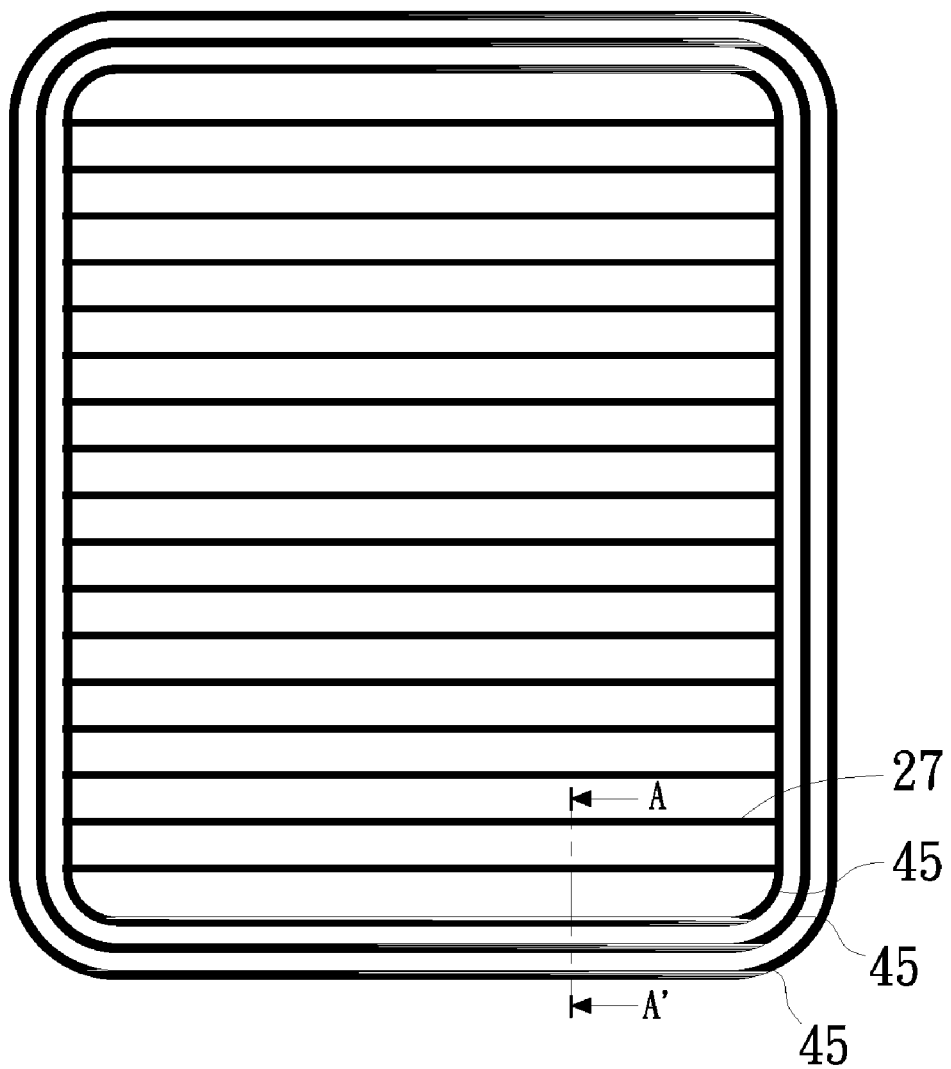
FIG. 4 is a top view of a MOS device in accordance with a preferred embodiment of the present invention.
Figure 5:
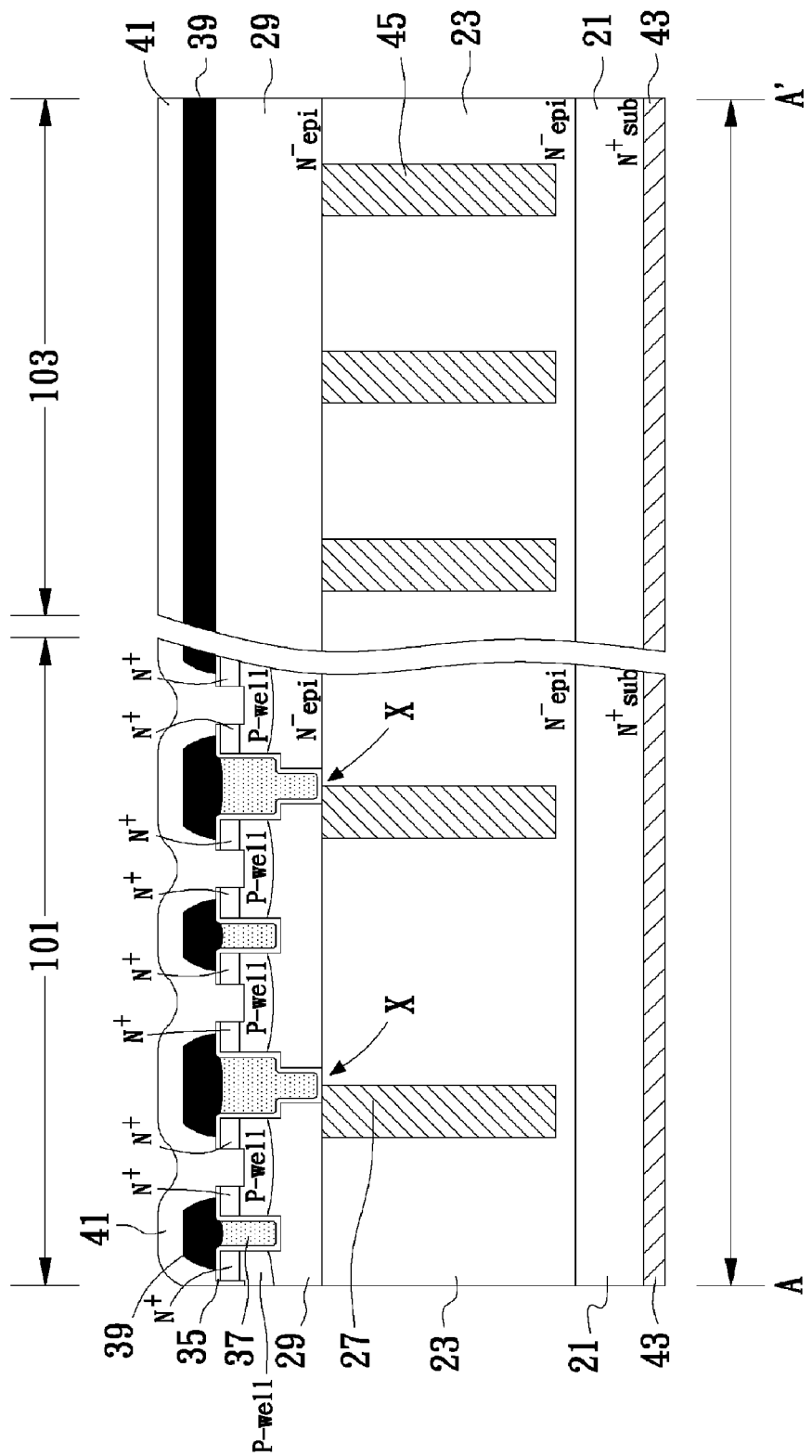
FIG. 5 is a cross-sectional view of a MOS device including a terminal region in accordance with another preferred embodiment of the present invention.

With reference to FIGS. 3 and 4, FIG. 4 shows a top view of a MOS device in accordance with a preferred embodiment of the present invention, and FIG. 3 shows the cross-sectional view along the Section AA' in FIG. 4. The terminal region epitaxial pillars 45 formed in the terminal region 103 are arranged in concentric rings to surround the epitaxial pillars 27 in the active region 101. Therefore, even if the epitaxial pillars 27 in the active region 101 are not aligned to the gate region precisely (as shown in Portion X of FIG. 5), the epitaxial pillars 27 can be electrically connected to a gate or a source of the MOS device through the concentric ring composed of the epitaxial pillars 45 in the terminal region 103 for maintaining the normal operation of the MOS device.

Figure 6A:
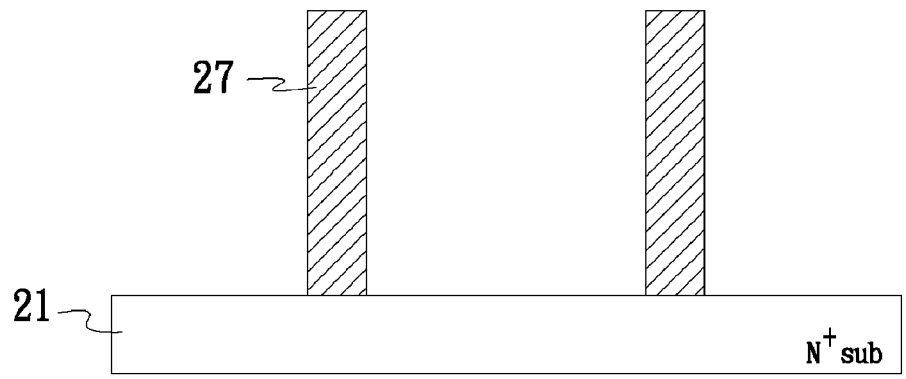
FIGS. 6A and 6B are cross-sectional views showing a manufacturing procedure of a MOS device in accordance with another preferred embodiment of the present invention.
Figure 6B:
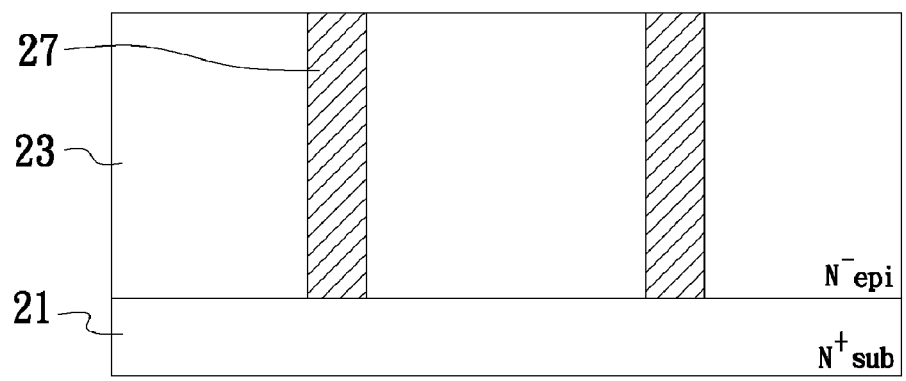

FIGS. 6A and 6B are cross-sectional views showing a manufacturing procedure of a MOS device in accordance with another preferred embodiment of the present invention. In contrast with the embodiment shown in FIGS. 2A to 2H, which features the first epitaxial layer 23 having a plurality of deep trenches 25 formed therein for allocating the epitaxial pillars 27, an epitaxial pillar layer is grown on the semiconductor base 21 in accordance with the present invention, and then the epitaxial pillar layer is etched to form the epitaxial pillars 27 (as shown in FIG. 6A). Afterward, the first epitaxial layer 23 is grown between the epitaxial pillars 27 (refer to FIG. 6B). The same method can be applied for forming the first epitaxial layer 23 and the epitaxial pillars 27 in the terminal region 103 to form the MOS structure as shown in FIG. 7.

In a preferred embodiment as shown in FIGS. 2A to 2H, an etching process is carried out for forming the deep trenches 25 in the first epitaxial layer 23, and then an epitaxial material is filled into the deep trenches 25 to form the epitaxial pillars 27. Due to the limitation of the width of the epitaxial pillar 27, the size of the opening of the deep trenches 25 is restricted, which makes the etching process for forming the deep trenches 25 as well as the depositing process for filling the deep trenches 25 quite difficult. In contrast, in the preferred embodiment as shown in FIGS. 6A and 6B, the epitaxial pillars 27 are formed first and then the first epitaxial layer 23 is formed between the epitaxial pillars 27. Since a larger space is left between the epitaxial pillars 27, the processes of etching the epitaxial pillar layer to form the epitaxial pillars 27 and filling the epitaxial material between the epitaxial pillars 27 to form the first epitaxial layer 23 are much easier than the processes of etching the deep trenches 25 and filling the deep trenches 25 respectively.

After the first epitaxial layer 23 and the epitaxial pillars 27 are formed in the aforementioned preferred embodiment, a second epitaxial layer 29 is formed on the first epitaxial layer 23, and then a source and a gate are formed. However, the present invention is not limited to such arrangement only. In another preferred embodiment, the source and the gate may be formed on the first epitaxial layer 23 with an appropriate thickness after the first epitaxial layer 23 and the epitaxial pillars 27 are formed. That is, the semiconductor substrate in this preferred embodiment is composed of the semiconductor base 21, the first epitaxial layer 23, and the epitaxial pillars 27.

Figure 8:
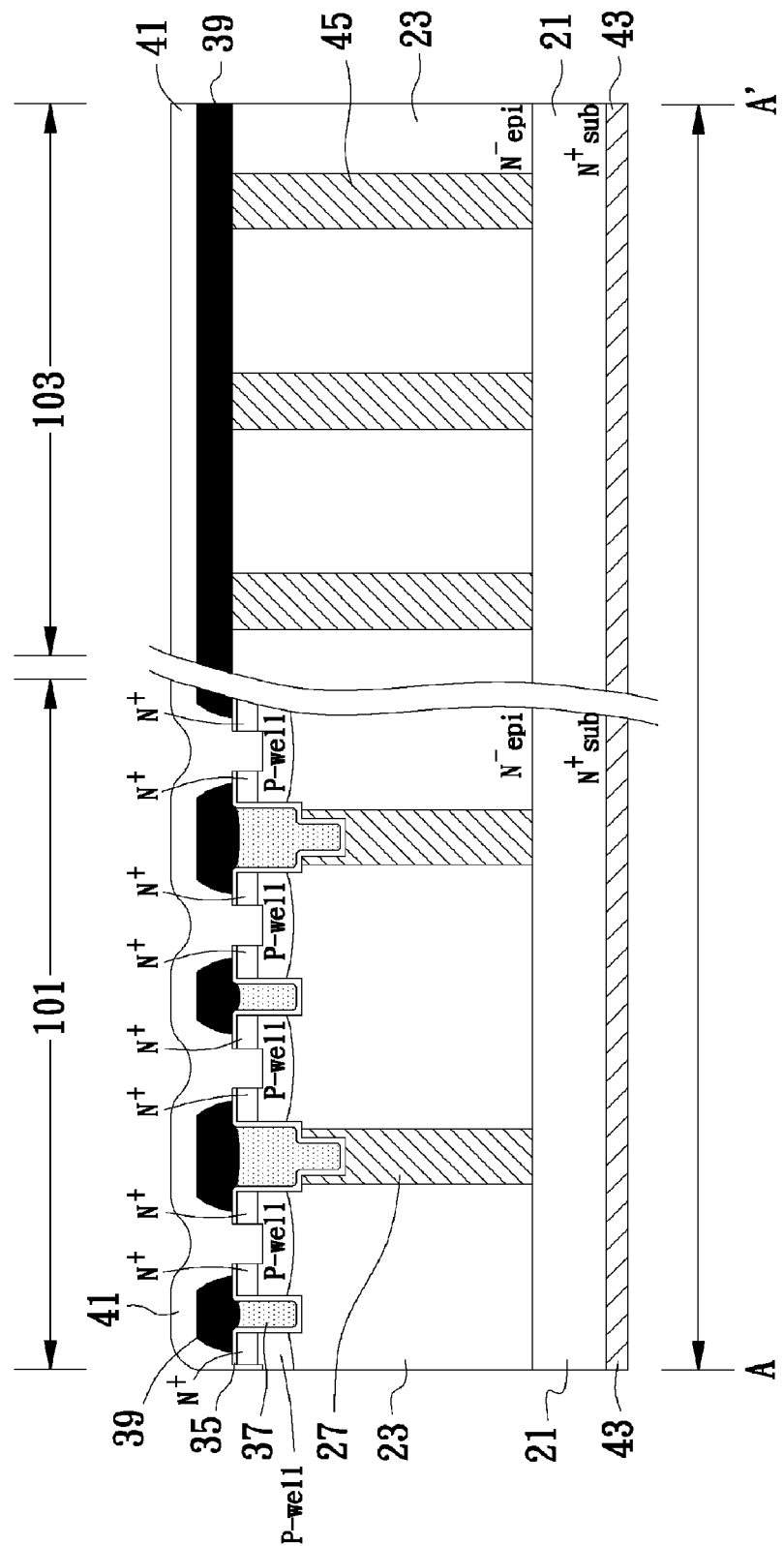
FIG. 8 is a cross-sectional view of a MOS device including a terminal region in accordance with still another preferred embodiment of the present invention.

The source regions and the gate regions can be formed on the first epitaxial layer 23 directly by using the fabrication process similar to that as shown in FIGS. 2C to 2F and 2G to 2H. That is, the first shallow trenches 31 and the second shallow trenches 33 are formed in the first epitaxial layer 23 directly, wherein the first shallow trenches 31 are located right on the top of the epitaxial pillars 27. The first shallow trenches 31 have a width greater than the width of the second shallow trenches 33, and the first shallow trenches 31 have a width greater than the width of the epitaxial pillars 27. Afterward, the gate region is formed in the first shallow trenches 31 as shown in FIGS. 2C to 2F. Then, as shown in FIGS. 2G and 2H, the source regions are formed individually on the sides of the first shallow trenches 31 and the second shallow trenches 33, and then the second dielectric layer 39 is formed as shown in FIGS. 2G and 2H. Thereafter, the source metal conducting wire 41 is formed for connecting the source region and the well so as to form the MOS device as shown in FIG. 8.

While the invention has been described by means of specific embodiments, numerous modifications and variations could be made thereto by those skilled in the art without departing from the scope and spirit of the invention set forth in the claims.

What is claimed is:

1. A metal oxide semiconductor (MOS) structure, comprising an active region, and the active region comprising:
   a semiconductor substrate, comprising:
      a semiconductor base of a first conduction type, having a first surface and a second surface;
      a first epitaxial layer, formed on the first surface, and having a plurality of deep trenches formed therein; and
      a plurality of epitaxial pillars, formed in the deep trenches, and having a conduction type opposite to that of the first epitaxial layer;
   a plurality of first shallow trenches and a plurality of second shallow trenches, alternately disposed in or above the first epitaxial layer in the semiconductor substrate, the first shallow trenches being extended downward to the corresponding epitaxial pillars, and the first shallow trenches having a width greater than that of the second shallow trenches;
   a plurality of gate regions, disposed in the first shallow trenches respectively;
   a plurality of source regions, formed between the first shallow trenches and the second shallow trenches; and
   a source metal conducting wire, coupled to the source regions.

2. The MOS structure of claim 1, wherein the semiconductor substrate further comprises a second epitaxial layer, formed on the first epitaxial layer, the first shallow trenches and the second shallow trench are alternately formed in the second epitaxial layer.

3. The MOS structure of claim 2, wherein the second epitaxial layer is of a conduction type opposite or identical to that of the first epitaxial layer.

4. The MOS structure of claim 1, wherein the deep trenches has a depth smaller than a thickness of the first epitaxial layer.

5. The MOS structure of claim 1, further comprising a terminal region, having a plurality of terminal region epitaxial pillars disposed in the semiconductor substrate and arranged surrounding the epitaxial pillars.

6. The MOS structure of claim 2, wherein the second shallow trenches are extended downward to the first epitaxial layer.

7. The MOS structure of claim 1, wherein the first shallow trench has a depth greater than that of the second shallow trench.

8. The MOS structure of claim 1, wherein the first shallow trench includes a ladder-type structure disposed on a sidewall of the first shallow trench for dividing the first shallow trench into an upper portion and a lower portion, and the upper portion has a width greater than that of the lower portion.

9. The MOS structure of claim 1, wherein a distance between two adjacent first shallow trenches is no greater than a distance between two adjacent epitaxial pillars.

10. The MOS structure of claim 1, wherein the second shallow trench includes a dielectric layer covered a sidewall and a bottom of the second shallow trench.

11. The MOS structure of claim 10, wherein the second shallow trench is filled with a polysilicon structure.

12. The MOS structure of claim 1, wherein the source regions are disposed on both sides of the first shallow trenches and the second shallow trenches respectively.

13. A metal oxide semiconductor (MOS) manufacturing method, comprising the steps of:

providing a semiconductor base of a first conduction type, and the semiconductor base having a first surface and a second surface;

forming a first epitaxial layer with a plurality of epitaxial pillars therein on the first surface of the semiconductor base, and the epitaxial pillar having a conduction type opposite to that of the first epitaxial layer;

forming a plurality of first shallow trenches and a plurality of second shallow trenches alternately above the epitaxial pillars, wherein the first shallow trench has a width greater than a width of the second shallow trench and the first shallow trench is extended downward to the epitaxial pillar;

forming a plurality of gate regions in the first shallow trenches respectively;

forming a plurality of source regions on both sides of the first shallow trench; and forming a source metal conducting wire to connect the source regions.

14. The MOS manufacturing method of claim 13, wherein the step of forming the first epitaxial layer with the epitaxial pillars therein comprises:

forming the first epitaxial layer on the first surface of the semiconductor base;

forming a plurality of deep trenches in the first epitaxial layer; and forming the epitaxial pillars in the deep trenches.

15. The MOS manufacturing method of claim 13, wherein the step of forming the first epitaxial layer with the epitaxial pillars therein comprises:

forming an epitaxial pillar layer on the first surface of the semiconductor base;

etching the epitaxial pillar layer to form the epitaxial pillars; and forming a first epitaxial layer of a conduction type opposite to that of the epitaxial pillar between the epitaxial pillars.

16. The MOS manufacturing method of claim 13, further comprising a step of forming a second epitaxial layer of the first conduction type on the epitaxial pillars and the first epitaxial layer, and the first shallow trenches and the second shallow trenches being formed in the second epitaxial layer.

17. The MOS manufacturing method of claim 13, wherein the deep trenches have a depth smaller than a thickness of the first epitaxial layer.

18. The MOS manufacturing method of claim 13, further comprising a step forming a plurality of terminal region epitaxial pillars surrounding the epitaxial pillars while forming the epitaxial pillars.

19. The MOS manufacturing method of claim 13, wherein the first epitaxial layer is of either a first conduction type or a second conduction type.

20. The MOS manufacturing method of claim 16, wherein the step of forming the first shallow trenches and the second shallow trenches comprises:

forming a pattern layer on the second epitaxial layer to define the first shallow trenches and the second shallow trenches, and a width of the first shallow trench being greater than that of the second shallow trench;

etching the second epitaxial layer through the pattern layer to form the first shallow trenches and second shallow trenches;

forming a protective layer covered a sidewall and a bottom of the first shallow trenches and filled up the second shallow trenches;

etching the protective layer to expose the bottom of the first shallow trenches; and etching the second epitaxial layer through the remaining protective layer and the pattern layer to form a plurality of caves at the bottom of the first shallow trenches.

21. The MOS manufacturing method of claim 13, wherein the first shallow trenches have a depth greater than that of the second shallow trenches.

22. The MOS manufacturing method of claim 13, further comprising a step of forming a polysilicon structure to fill up the second shallow trenches during the step of forming the gate region in the first shallow trenches.

23. The MOS manufacturing method of claim 13, further comprising a step of forming the source regions on both sides of the second shallow trenches respectively during the step of forming the source regions on both sides of the first shallow trenches.

24. The MOS manufacturing method of claim 20, wherein the protective layer is a silicon nitride layer.

* * * * *